(12) United States Patent
Kim (10) Patent No.: US 7,411,161 B2
(45) Date of Patent: Aug. 12, 2008

(54) SUSCEPTOR FOR DEPOSITION PROCESS EQUIPMENT AND METHOD OF FABRICATING A HEATER THEREIN

(75) Inventor: Hong Yeol Kim, Gumi-si (KR)

(73) Assignee: LG. Display Co., Ltd, Seoul (KR)

( * ) Notice: Subject to any disclaimer, the term of this patent is extended or adjusted under 35 U.S.C. 154(b) by 0 days.

(21) Appl. No.: 10/950,215

(22) Filed: Sep. 24, 2004

(65) Prior Publication Data

US 2005/0092732 A1    May 5, 2005

(30) Foreign Application Priority Data

Oct. 31, 2003    (KR)    ................. 10-2003-0076747

(51) Int. Cl.
*H05B 3/68* (2006.01)
*C23C 16/00* (2006.01)

(52) U.S. Cl. .................... 219/444.1; 118/724

(58) Field of Classification Search ......... 219/443.1, 219/444.1, 465.1, 390, 523, 544; 392/416, 392/418; 118/724, 725; 29/610.1, 611, 613, 29/614

See application file for complete search history.

(56) References Cited

U.S. PATENT DOCUMENTS

| | | | | |
|---|---|---|---|---|
| 3,582,616 A | * | 6/1971 | Wrob | ............ 219/541 |
| 3,694,626 A | * | 9/1972 | Harnden, Jr. | ............ 219/541 |
| 4,002,799 A | * | 1/1977 | Dumesnil et al. | ............ 428/428 |
| 5,296,414 A | * | 3/1994 | Nakagawa et al. | ............ 501/20 |
| 5,844,205 A | * | 12/1998 | White et al. | ............ 219/390 |
| 5,916,832 A | * | 6/1999 | Tanabe et al. | ............ 501/17 |

FOREIGN PATENT DOCUMENTS

| | | |
|---|---|---|
| CN | 1214355 | 4/1999 |
| JP | H4-160034 | 6/1992 |
| JP | 10-32238 | 2/1998 |
| JP | 11204329 | 7/1999 |
| JP | 2001-271178 | 10/2001 |
| WO | WO 03/017726 | 2/2003 |

OTHER PUBLICATIONS

Office Action dated Oct. 27, 2006 for corresponding Chinese Patent Application No. 200410055714.9.
Office Action for corresponding Japanese Patent Application Serial No. 2004-311795, dated Jul. 30, 2007.

* cited by examiner

*Primary Examiner*—S. Paik
(74) *Attorney, Agent, or Firm*—Brinks Hofer Gilson & Lione (57) ABSTRACT

A susceptor for deposition process equipment is provided. The susceptor includes a heater that heats the susceptor. The heater includes a sheath. The sheath surrounds a heating wire and is filled with an insulating ceramic material. An isolation layer is formed opposing ends of the sheath to isolate the ceramic material from the ambient environment. The isolation layer is formed from a lead/glass mixture that blocks moisture in the ambient environment from being absorbed by the insulating material. Input/output terminals are connected to the heating wire. The input/output terminals pass through the isolation layer and are exposed to the ambient environment. Current is supplied to the heating wire through the input/output terminals to heat the heating wire.

22 Claims, 6 Drawing Sheets

SUSCEPTOR FOR DEPOSITION PROCESS EQUIPMENT AND METHOD OF FABRICATING A HEATER THEREIN

CLAIM FOR PRIORITY

This application claims the benefit of Korean Application No. P2003-76747, filed on Oct. 31, 2003, which is hereby incorporated by reference as if fully set forth herein.

BACKGROUND

1. Technical Field

The present invention relates to deposition process equipment, and more particularly, to a susceptor for deposition process equipment, in which a resistance of an insulating ceramic material can be kept constant.

2. Related Art

Thanks to development of semiconductor and display device manufacturing technologies, various kinds of devices can be formed on a large substrate. Large substrates have at least 4-6 inch diameters. Uniform deposition of a thin film over the large substrate enables manufacture of superfine and superprecise devices. However, it is practically very difficult to deposit the thin film uniformly on the large substrate.

One type of device fabricated on large substrates is a liquid crystal display (LCD). The LCD includes an array substrate and a color filter substrate. A plurality of gate bus lines and a plurality of data bus lines perpendicularly crossing the plurality of gate bus lines are arranged to define a plurality of unit pixel regions on the array substrate. On each of the unit pixel regions, a pixel electrode made of a transparent metal, for example, indium tin oxide (ITO) and a thin film transistor (TFT) functioning as a switching device are formed. A plurality of R, G, and B color filters corresponding to the unit pixels are formed on the color filter substrate. The array substrate and the color filter substrate are attached to each other with a liquid crystal layer interposed therebetween. A metal layer, an insulating layer, an amorphous Si layer, and the like are sequentially formed on the transparent insulating substrate and etched through using 4-7 mask processes, thereby forming the gate bus lines, the data bus lines, a TFT channel layer, and source/drain electrodes.

Generally, plasma enhanced chemical vapor deposition (PECVD) is widely used to deposit a uniform thin film that forms the insulating layer during fabrication of semiconductor devices. Heating is desirable for stable growth of the deposition layer on the target substrate, such as glass or semiconductors. If the heating temperature is not optimized, the deposition layer grows unstably.

Figure 1:
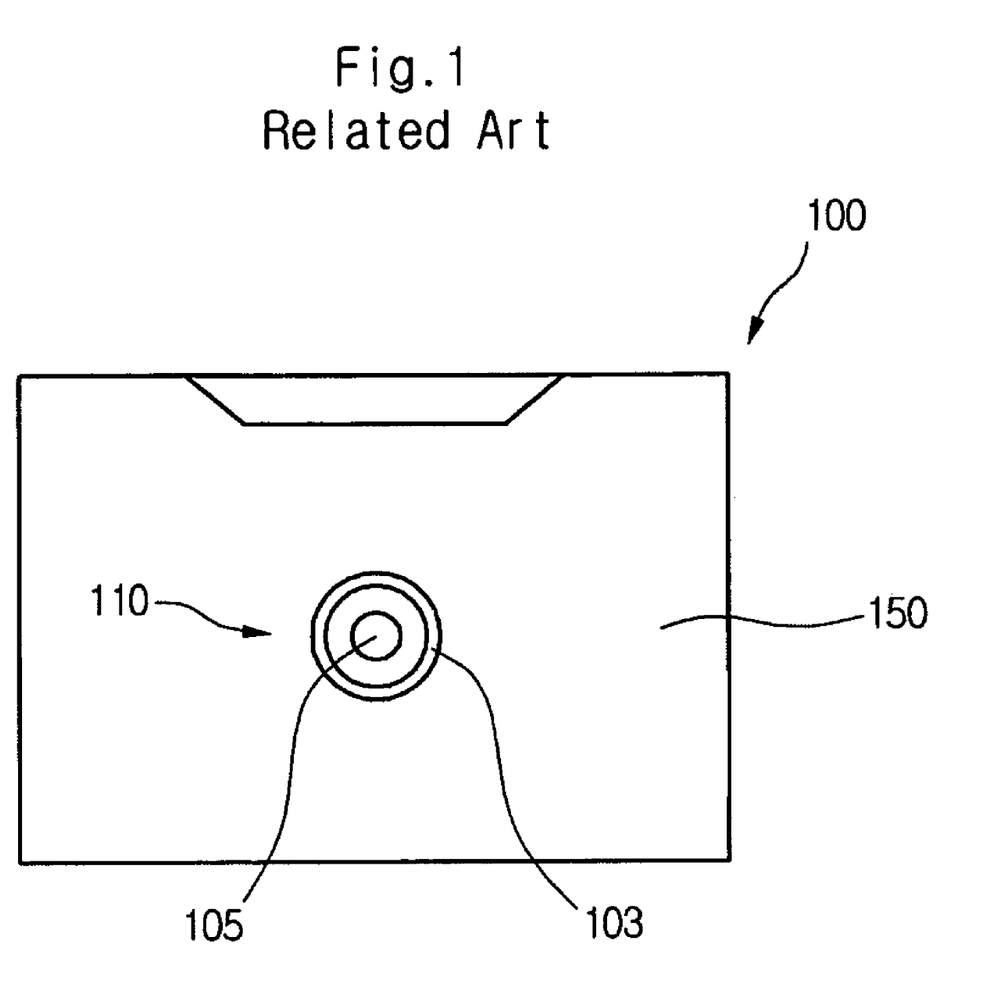
FIG. 1 is a plan view showing a susceptor coupled with a heater according to the related art.
Figure 2:
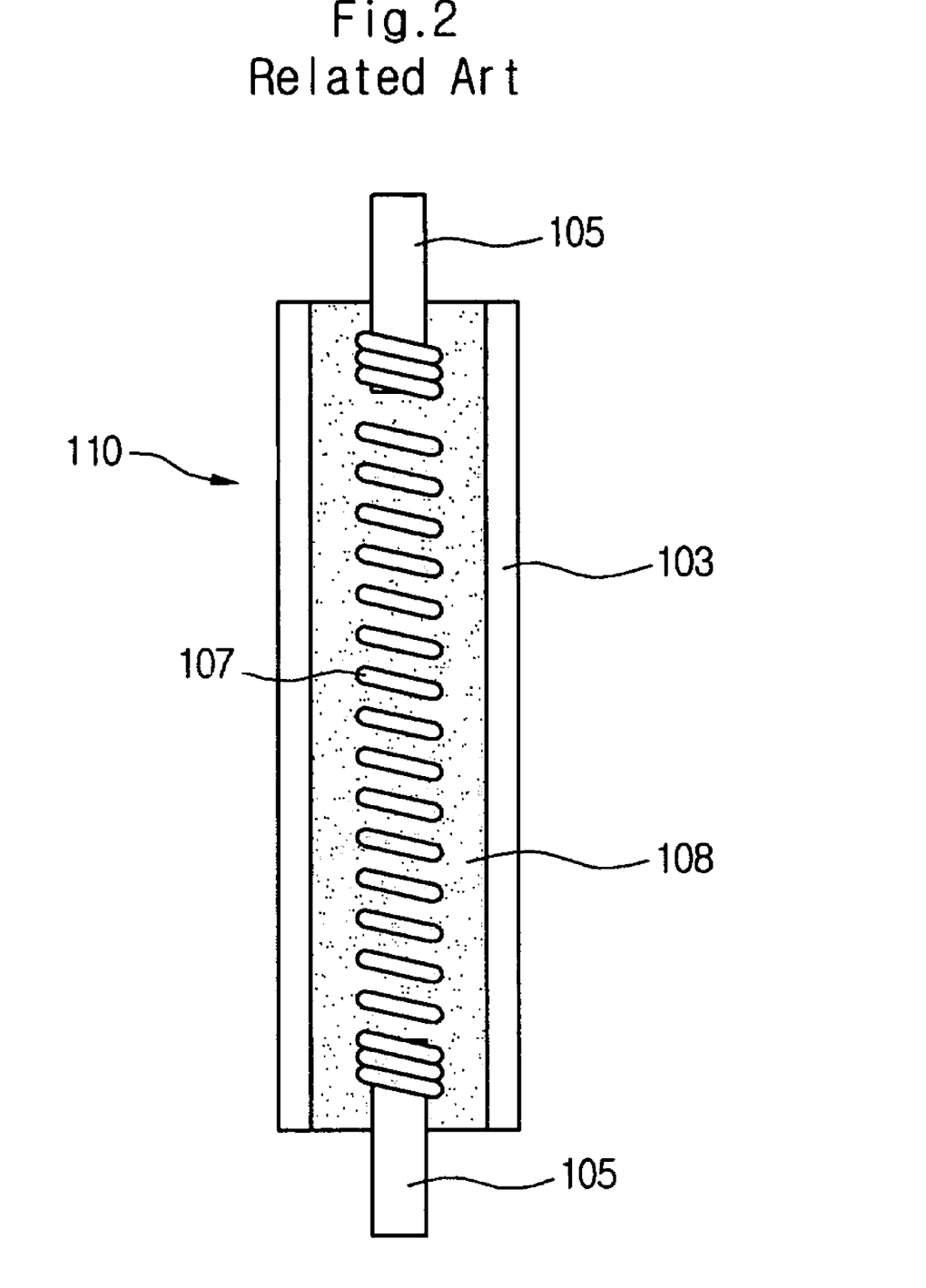
FIG. 2 is a sectional view showing a structure of a heater according to the related art.

FIG. 1 is a plan view showing a susceptor coupled with a heater according to the related art. FIG. 2 is a sectional view showing a structure of a heater according to the related art.

Referring to FIGS. 1 and 2, a target substrate (not shown) is received on a susceptor provided in the PECVD or CVD equipment. The susceptor 100 includes a substrate 150 having a flat rectangular shape, a shaft (not shown) supporting the substrate 150, and heaters 110. Three or four heaters 110 are spaced apart by a predetermined interval from one another and are coupled to the susceptor 100 in a parallel direction with the substrate 150. Each of the heaters 110 includes a sheath 103 surrounding a heating wire 107 and input/output terminals 105 connected to the heating wire 107 to apply a current thereto.

Referring again to FIG. 2, the heater 110 includes the heating wire 107 generating heat, the input/output terminals 105 connected to both ends of the heating wire 107 to apply a current thereto, the sheath 103 surrounding the heating wire 107 with disposing a predetermined space therebetween, and an insulating ceramic material 108 filled in the predetermined space. That is, the input/output terminals 105 and the heating wire 107 connected to the input/output terminals 105 are provided in the interior of the sheath 103, and the predetermined space of the sheath 103 is filled with the insulating ceramic material 108. The insulating ceramic material 108 has a high resistance and high heat conductivity. Therefore, heat generated from the heating wire 107 is rapidly transferred to the sheath 103 and then the substrate 150 contacted with the sheath 103 is heated. MgO-based powder materials are generally used for the insulating ceramic material 108.

However, when the MgO-based insulating ceramic material 108 is used for the heaters 110 coupled to the susceptor 100, the insulating ceramic material 108 is exposed to ambient air at a top and a bottom of the sheath 103. The insulating ceramic material 108 absorbs moisture contained in the ambient air when contacting the ambient air. As the insulating ceramic material 108 absorbs the moisture, the resistance of the insulating ceramic material 108 decreases. Generally, a standard resistance range of the insulating ceramic material 108 is 2 MΩ to 20 MΩ. However, when the resistance decreases below the standard resistance range, the heating wire 107 breaks. The breakage of the heating wire 107 is one of the main reasons that the products resulting from the deposition contain defects. Further, the resistance drop of the insulating ceramic material 108 increases the current applied through the input/output terminals 105, thereby possibility causing a short-circuit between the heating wires 107 connected with the input/output terminals 105.

SUMMARY

By way of introduction only, in one embodiment, a susceptor for deposition process equipment contains at least one heater, which includes an input/output terminal exposed to an exterior at both ends of the heat, a heating element connected with the input/output terminal, a sheath surrounding the heating element, a ceramic material filled within the sheath, and an isolation layer formed at both ends of the sheath.

The isolation layer isolates the ceramic material from the exterior in order to prevent the ceramic material from absorbing moisture of an ambient air, thereby fundamentally preventing a resistance drop of the ceramic material.

The isolation layer may be a heavy metal oxide, which is a mixed material including lead (Pb) and a glass. Therefore, the isolation layer has a core density of more than or equal to 5 g/cm$^3$ owing to the heavy metal oxide, thereby providing a complete isolation property.

The isolation layer may be formed to have a thickness of about 5 mm to about 15 mm.

According to the present invention, there is provided a method for fabricating a heater in a susceptor for a deposition process equipment, comprising: preparing a sheath; arranging a heating element within the sheath; filling in the sheath a ceramic material; connecting an input/output terminal to the heating element at each end of the sheath and making it exposed to an exterior; and forming an isolation layer at both ends of the sheath.

The isolation layer is formed by heating a heavy metal oxide at a temperature ranging from 100° C. to 550° C.

It is to be understood that both the foregoing general description and the following detailed description of the present invention are exemplary and explanatory and are intended to provide further explanation of the invention as claimed.

BRIEF DESCRIPTION OF THE DRAWINGS

The inventions can be better understood with reference to the following drawings and description. The components in the figures are not necessarily to scale, emphasis instead being placed upon illustrating the principles of the inventions. Moreover, in the figures, like referenced numerals designate corresponding parts throughout the different views.

DETAILED DESCRIPTION OF THE EMBODIMENTS

Reference will now be made in detail to the embodiments of the present invention, examples of which are illustrated in the accompanying drawings.

Figure 3:
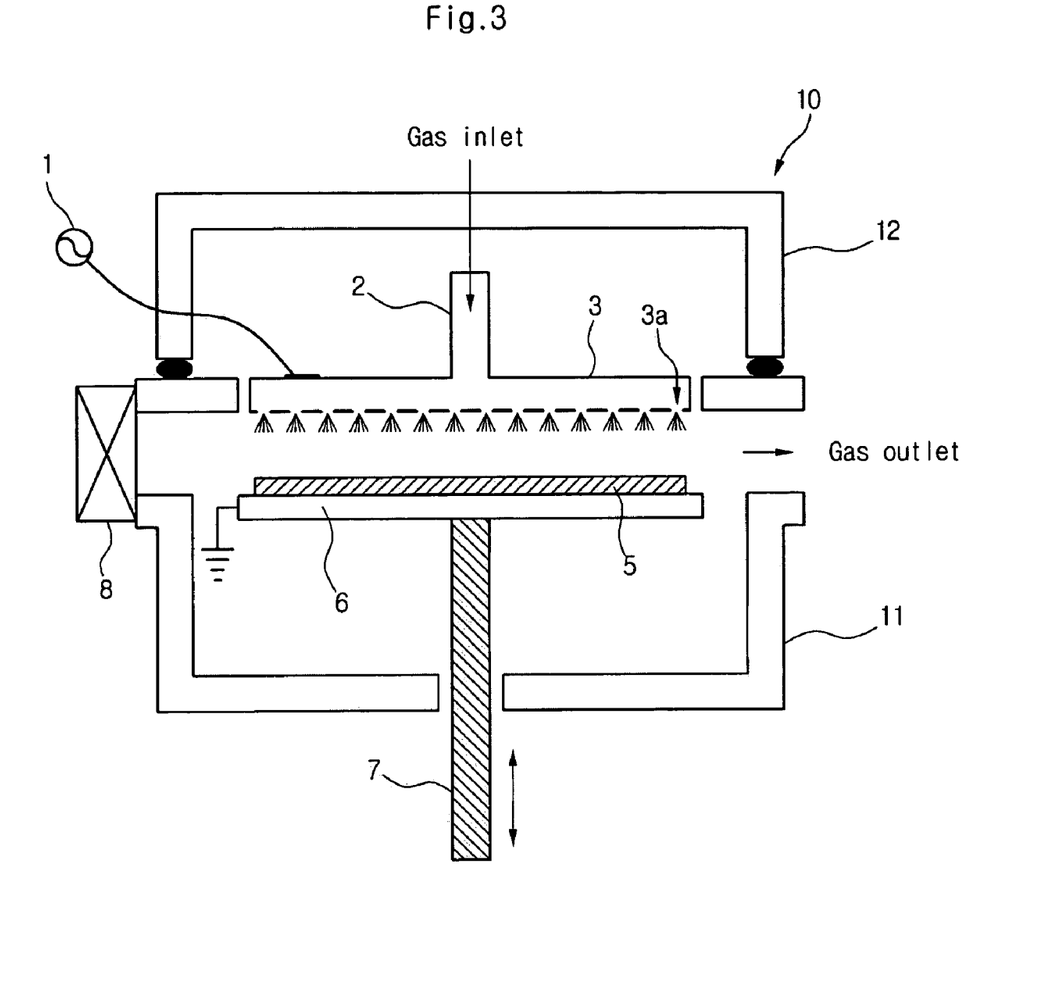
FIG. 3 is a sectional view schematically showing a structure of PECVD equipment.

A deposition process that forms a metal layer, an insulating layer, a passivation layer, or a semiconductor layer, for example, while maintaining a predetermined temperature and pressure is used in manufacturing a LCD or other electronic device. Plasma-enhanced chemical vapor deposition (PECVD) or chemical vapor deposition (CVD) equipment is generally used in forming an insulating layer on a wafer during semiconductor manufacturing processes. FIG. 3 is a sectional view schematically showing the structure of conventional PECVD equipment.

Referring to FIG. 3, the PECVD equipment 10 includes a reaction chamber 11 at a lower side and a chamber lid 12 at an upper side, which form a completely sealed reaction space therebetween. An O-ring may be inserted onto an adhesive face between the reaction chamber 11 and the chamber lid 12 to seal the two together and prevent ambient air from flowing into the reaction space. A susceptor 6 is provided in the reaction space. The susceptor 6 can be transferred in an up and down direction by transfer means 7 and is electrically grounded. A target substrate 5, such as an array substrate of a LCD device, may be mounted on the susceptor 6 for deposition.

A showerhead type plasma electrode 3 is provided in an upper portion of the reaction space corresponding to the susceptor 6. The plasma electrode 3 is connected with an external RF power supply 1 and has a hollow interior and a gas inlet tube 2. The gas inlet tube 2 is integrally formed in a predetermined portion of a top surface of the plasma electrode 3 to introduce a gas therethrough for a plasma discharge. This permits the gas introduced through the gas inlet tube 2 to be transferred to the interior of the plasma electrode 3. Further, the plasma electrode 3 is provided with a plurality of injection holes 3 an in a predetermined portion of a bottom surface of the plasma electrode 3. The injection holes 3a have diameters of several millimeters and are spaced apart from each other by several centimeters. Therefore, the gas is introduced into the plasma electrode 3 through the gas inlet tube 2 and injected to the reaction space through the injection holes 3a. The gas in the reaction space is plasma-discharged by a potential difference between the plasma electrode 3 and the susceptor 6. The target substrate 5 mounted on the susceptor 6 is subject to deposition by the plasma discharge. The gas remaining after the deposition is discharged through a gas outlet tube.

Generally, the plasma electrode 3 is made of a metal material, such as stainless steel, aluminum or the like. The surface of the plasma electrode 3 is anodized to prevent an arc discharge resulting from the plasma discharge.

A load rock part (not shown) and a gate 8 are provided at a portion of a sidewall of the reaction chamber 11. The load rock part permits loading of the target substrate 5, and the gate 8 opens and closes to load the load rock part. That is, the target substrate 5 can be mounted on the susceptor 6 by opening the gate 8 and transferring the load rock part to the reaction space. In other words, the target substrate 5 is initially mounted on the load rock part and is then mounted on the susceptor 6 by transferring the load rock part to the reaction space.

The PECVD equipment having the aforementioned structure changes the gas in the reaction space into plasma state using the potential difference between the plasma electrode 3 and the susceptor 6, thereby forming a deposition layer on the target substrate 5. When the target substrate 5 is loaded on the susceptor 6, the pressure in the reaction space is adjusted to a required level for depositing the deposition layer on the target substrate 5, and the target substrate 5 is heated to a required level by supplying power to the heating means provided in the susceptor 6 in order to grow the deposition layer on the target substrate 5.

Figure 4:
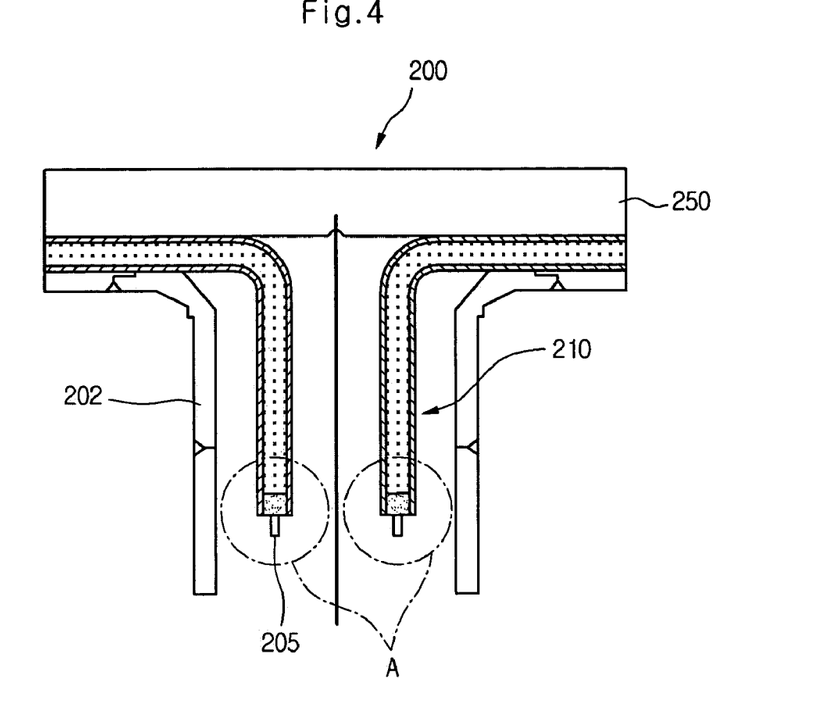
FIG. 4 is a sectional view showing the susceptor for the PECVD equipment according to the present invention.

FIG. 4 is a sectional view showing a susceptor for PECVD equipment according to one embodiment of the present invention. Referring to FIG. 4, a susceptor 200 provided in the PECVD or CVD equipment stably receives a target substrate 250 for deposition. The susceptor 200 includes a shaft 202 supporting the substrate 250, and heaters 210. The substrate 250 has, for example, a flat rectangular shape. The substrate 250 may contact the heater 210, or a conductive layer may be disposed between the heater 210 and the substrate 250.

The shaft 202 can be moved in an upward or downward direction perpendicular to the substrate 250. The heater 210 heats the substrate 250 to maintain the substrate 250 at a predetermined temperature during the deposition process. The heater 210 is provided below the substrate 250. In more detail, at a central area of the substrate 250, the heater 210 is disposed inside the shaft 202, and from a peripheral edge to a central area of the substrate 250, the heater 210 is disposed parallel to the substrate 250 and between the substrate 250 and the shaft 202. The shaft 202 is thus bent from the central portion of the substrate 250 along the peripheral edge.

Figure 5:
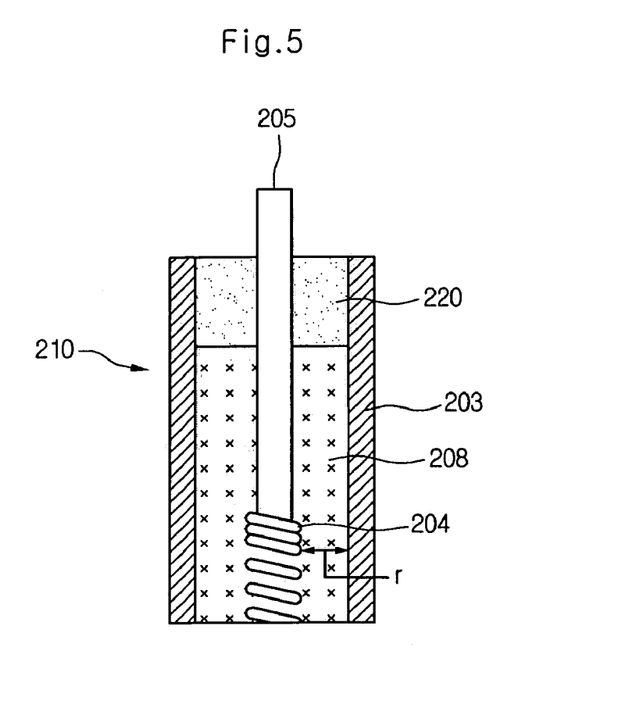
FIG. 5 is a partially enlarged view of A in FIG. 4, showing a portion of the heater coupled to the susceptor.

FIG. 5 is a partially enlarged view of A in FIG. 4, showing a portion of the heater coupled to the susceptor. Referring to FIG. 5, the heater 210 includes an input/output terminal 205 having an end exposed outwardly. A heating element such as a resistor or a heating wire 204 is connected with the input/output terminal 205 to generate the heat. The input/output terminal 205 is connected with, for example, a power supply (not shown) or ground (not shown), as well as the heating wire 204 and thereby permit current to pass therethrough. A sheath 203 surrounds the heating wire 204 and an insulating ceramic material 208, for example, is filled within the sheath 203 to insulate the heating wire 204. An isolation layer 220 is formed at an end of the sheath 203 to seal the periphery of the outwardly exposed input/output terminal 205 to mitigate or prevent the insulating ceramic material 208 from being exposed to the ambient environment.

The input/output terminal 205 is an input/output terminal through which current is applied to the heating wire 204. The input/output terminal 205 is partially exposed to the exterior from the sheath 203. As shown in FIG. 4, each end of the sheath 203 is also provided with an input/output terminal 205 and an isolation layer 220.

The heating wire 204 is connected with an end of the input/output terminal 205 and receives the current through the input/output terminal 205 to generate heat. The heating wire 204 and the input/output terminal 205 are disposed inside the sheath 203. The heating wires may be short-circuited if not insulated between the heating wires. The insulating ceramic material 208 made of MgO-based material is filled within the sheath 203 to prevent the short circuit between the heating wires. The MgO-based material has a high resistance and high heat conductivity and is widely used for the insulating ceramic material 208. The insulating ceramic material 208 withstands the heat generated during deposition of the various material layers in the device. In one example, the insulating ceramic material 208 withstands a temperature of about 400° C., which is greater than the temperature used to deposit a passivation layer (280-300° C.), gate insulating layer (300-360° C.), or semiconductor layer (300-360° C.) on the substrate 250.

As above, the isolation layer 220 is hermetically formed at one end or both ends of the sheath 203 in which the insulating ceramic material 208 is filled, to prevent the insulating material 208 from being exposed to the exterior. The isolation layer 220 comprises a heavy metal oxide. The heavy metal oxide is a mixed material including lead (Pb) and a glass. The mixed material is disposed within the sheath 203 and then heated to a temperature of 100° C. to 550° C. to form the isolation layer 220 and hermetically seal one or both ends of the sheath 203.

The composition ratio of the lead and the glass for the isolation layer 220 may be adjusted. Generally, the amount of lead ranges from 30 wt % to 90 wt % lead so that the core density of the isolation layer 220 is more than or equal to 5 g/cm$^3$. The core density of the isolation layer 220 is high as it includes a considerable amount of the heavy metal oxide, which increases the ability of the isolation layer 220 to better isolate the insulating ceramic material 208. In addition, the isolation layer 220 has a thickness of about 5 mm to 15 mm from the end exposed to the ambient environment to an end disposed inside the sheath 203. This permits the isolation layer 220 to adequately prevent moisture in the ambient atmosphere from permeating the insulating ceramic material 208, so that the resistance of the insulating ceramic material 208 is maintained at a value higher than the standard resistance of 20 MΩ.

The increased resistance and isolation ability permits the isolation layer 220 to be used in a large heater as well as a small heater. In larger heaters, which carry more current and thus use a heating wire with a larger diameter, if the diameter of the sheath 203 remains the same as in a smaller heater, the distance "r" between the heating wire 204 and the sheath 203 is narrowed. If the resistance of the insulating ceramic material 208 remains constant, e.g. does not absorb moisture, the diameter of the sheath need not be increased even though a smaller of insulating material is present between the isolation layer 220 and the sheath 203. This permits PECVD equipment or CVD equipment in which a high temperature state is desired to be attained without increasing the overall size of the heater 210.

The heater in the susceptor described above can be fabricated by first preparing a sheath. The heating element (wire) is then arranged within the sheath. A ceramic material is filled in the sheath and an input/output terminal is connected to the heating wire at each end of the sheath so that the input/output terminal is exposed to the exterior of the sheath. The isolation layer is then formed at both ends of the sheath.

Figure 6A:
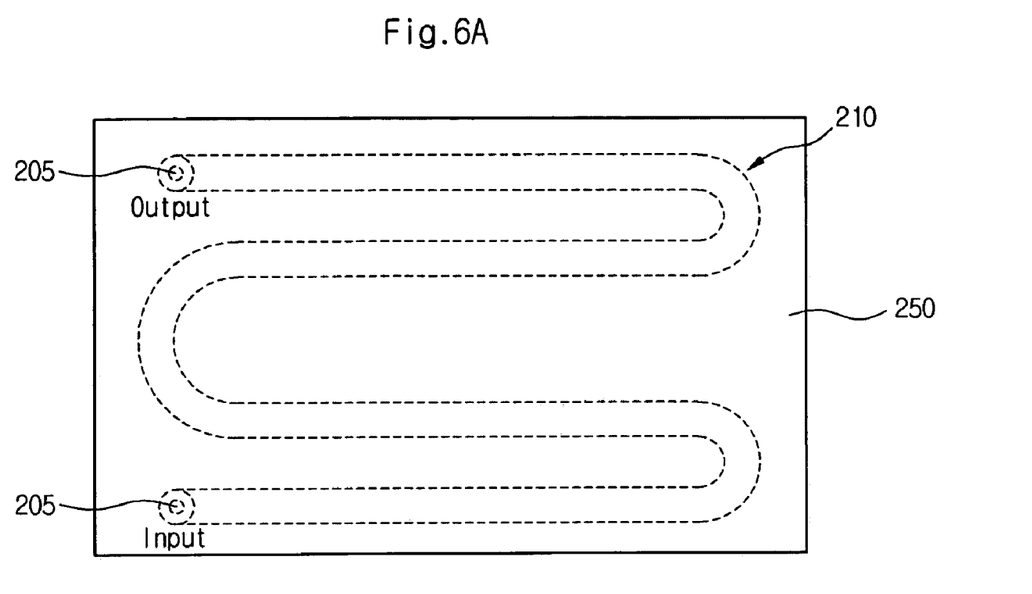
FIGS. 6A-6C are perspective views showing different embodiments of the heater.
Figure 6B:
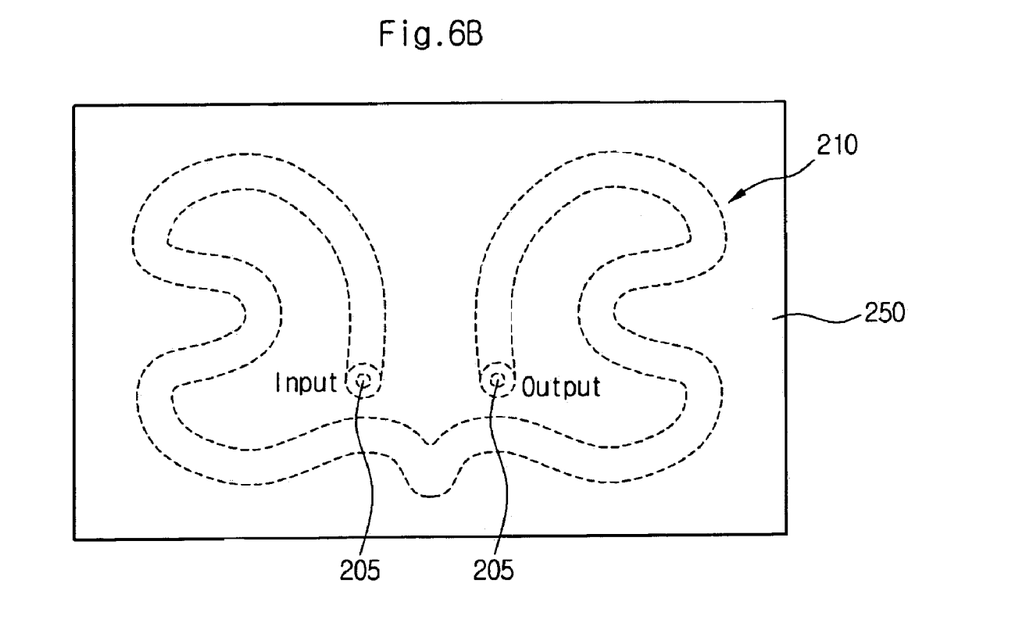
Figure 6C:
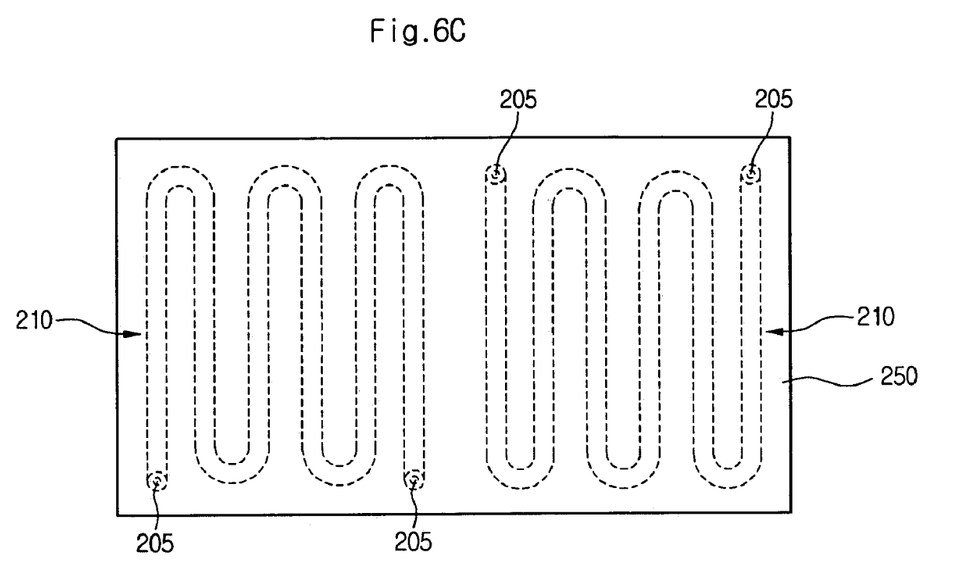

As above, the heater includes one or more sheaths containing one or more heating wires or other heating elements. FIGS. 6A-6C illustrate different embodiments in which a substrate 250 is disposed on the heater 210. The heater 210 may be arranged, for example, in a grid shape (as shown in FIG. 6A) or a butterfly shape (as shown in FIG. 6B). FIG. 6C illustrates an embodiment containing multiple symmetrically arranged grid heaters 210 on which the substrate 250 is disposed. As shown in FIG. 6C, each heater 250 is disposed in a different non-overlapping area, thus the substrate 250 is split into different zones with each zone being heated by a different heater 250. Each heater 250 in the various embodiments has input/output terminals that include an input end, from which current flows into the heater 250, and an output end, from which current flows from the heater 250. A voltage or current source (not shown) connected to the input end of the heater 250 supplies the current and the output end of the heater 250 is connected to ground, for example. In all embodiments, the heater(s) 210 is disposed such that substantially the entire area of the substrate 250 disposed on the heater 210 is heated uniformly.

As described above, the isolation layer is formed in the heater that heats the susceptor of the deposition process equipment, in order to isolate the insulating ceramic material from the exterior. This permits the insulating ceramic material to maintain a constant resistance and minimize breakage of the heating wire or a short circuit between the heating wires.

It will be apparent to those skilled in the art that various modifications and variations can be made in the present invention. For example, the density and resistances may vary as may the composition of the insulating or isolation material. Additionally, the heater and/or susceptor described may be used in a variety of processes used in the fabrication of electronic structures, not only PECVD or CVD. Such other processes include metallization, such as sputtering, or crystal growth, such as in a semiconductor growth chamber. Thus, it is intended that the present invention covers the modifications and variations of this invention provided they come within the scope of the appended claims and their equivalents.

What is claimed is:

1. A deposition chamber for a PECVD apparatus comprising:
    a reaction chamber and chamber lid;
    a susceptor disposed in an enclosure formed by the reaction chamber and chamber lid, the susceptor containing a shaft and a heater for heating the susceptor, wherein the heater is a sheath heater, the heater containing: a heating element, an input/output terminal connected with the heating element, a sheath surrounding the heating element, an insulating material within the sheath, and an isolation layer formed at ends of the sheath, the isolation layer having a first end exposed to an ambient environment and a second end disposed inside the sheath; and
    a gate in apportion of a sidewall of the reaction chamber to permit a substrate to be loaded on the susceptor, wherein the heater is disposed in the susceptor, and wherein the substrate is loaded to directly contact the heater and supported by the heater.

2. The deposition chamber of claim 1, wherein the heater is formed on a top surface of the susceptor on which a substrate loaded from the gate is retained.

3. The deposition chamber of claim 1, wherein substantially an entire area of a surface of the susceptor is formed by the heater.

4. The deposition chamber of claim 1, wherein the heater is disposed such that substantially an entire area of a substrate disposed on the heater is heated uniformly.

5. The deposition chamber of claim 1, further comprising a plasma electrode containing a gas inlet tube to introduce a gas therethrough and a plurality of injection holes disposed such that the gas introduced to the plasma electrode through the gas inlet tube is injected from the plasma electrode toward the susceptor.

6. The deposition chamber of claim 1, further comprising a transfer rod that permits a position of the susceptor to be adjusted toward or away from the reaction chamber and permits the susceptor to be electrically grounded.

7. The deposition chamber of claim 1, wherein input/output terminals connected to the heating element pass through the isolation layers and are exposed to an ambient environment surrounding the sheath.

8. The deposition chamber of claim 1, wherein a volume between the heating element and the sheath is filled with the insulating material.

9. The deposition chamber of claim 1, wherein the insulating material provides a resistance of at least 20 □ between the heating element and the sheath.

10. The deposition chamber of claim 1, wherein the isolation layers prevent moisture in an ambient environment external to the heater from contacting the insulating material.

11. The deposition chamber of claim 1, wherein the isolation layers have a density and a thickness sufficient to prevent moisture in an ambient environment external to the heater from permeating therethrough.

12. The deposition chamber of claim 1, wherein the susceptor contains a plurality of heaters.

13. The deposition chamber of claim 12, wherein the heaters are disposed in non-overlapping areas.

14. The deposition chamber of claim 12, wherein the heaters are symmetrically disposed in an area of the heaters adapted to receive the loaded substrate.

15. The deposition chamber of claim 12, wherein the heaters are disposed such that heat is uniformly provided to substantially an entire area of the loaded substrate disposed on the heater.

16. A method for fabricating an LCD, the method comprising:
forming a material layer on a substrate using a PECVD apparatus that comprises a susceptor, wherein the susceptor comprises a heater for heating the susceptor, wherein the heater is a sheath heater, the heater including: a heating element; an input/output terminal connected with the heating element; a sheath surrounding the heating element; an insulating material within the sheath; and an isolation layer formed at ends of the sheath, the isolation layer having a first end exposed to an ambient environment an a second end disposed inside the sheath, wherein the heater is disposed in the susceptor, and wherein the substrate is loaded to directly contact the heater and supported by the heater.

17. The method of claim 16, wherein the insulating material comprises a ceramic material.

18. The method of claim 16, wherein the heater has a plurality of elements, each of which is formed in a grid shape.

19. The method of claim 16, wherein the heater is formed in a grid shape.

20. The method of claim 16, wherein the heater is formed in a butterfly shape.

21. The method of claim 16, wherein forming a material layer comprising forming one of a metal layer, an insulating layer, a passivation layer, or a semiconductor layer.

22. The method of claim 16, wherein forming a material layer comprises forming an insulating layer.

* * * * *